United States Patent [19]
Tomioka et al.

[11] Patent Number: 5,510,395
[45] Date of Patent: Apr. 23, 1996

[54] FILM FORMING SOLUTION, POROUS FILM OBTAINED THEREFROM AND COATED MATERIAL WITH THE POROUS FILM

[75] Inventors: Isao Tomioka; Minoru Saito; Hiroshi Yamada; Yoshiaki Iwaya; Yoshiaki Echigo, all of Kyoto, Japan

[73] Assignee: Unitika, Ltd., Hyogo, Japan

[21] Appl. No.: 194,310

[22] Filed: Feb. 10, 1994

[30] Foreign Application Priority Data

Feb. 10, 1993 [JP] Japan .................................. 5-045879

[51] Int. Cl.$^6$ ........................... B32B 15/08; C08G 63/44; C08G 69/44; C08G 73/10
[52] U.S. Cl. ........................ 521/184; 521/185; 521/189; 428/458; 428/473.5
[58] Field of Search ...................... 422/388.1; 428/473.5, 428/458; 528/353; 521/184, 185, 189

[56] References Cited

U.S. PATENT DOCUMENTS

| | | | |
|---|---|---|---|
| 4,535,115 | 8/1985 | Bakshi et al. | 524/376 |
| 4,923,954 | 5/1990 | Klobucar et al. | 528/183 |
| 5,183,611 | 2/1993 | Yosomiya et al. | 427/343 X |

FOREIGN PATENT DOCUMENTS 0532953  3/1993  European Pat. Off. .

OTHER PUBLICATIONS

Abstract of JP-A 53-78282, Jan., 1980.

*Primary Examiner*—Michael Lusignan
*Attorney, Agent, or Firm*—Sughrue, Mion, Zinn, Macpeak & Seas

[57] ABSTRACT

A film forming solution which does not require aprotic polar solvents, a porous film of poly(4,4'-oxydiphenylenepyromellitimide) obtained from the film forming solution which has excellent heat and chemical resistances, which is controllable in terms of porosity and pore size of the film and which has excellent electrical characteristics, and a coated material where the porous film is formed on a base material.

Particularly, a film forming solution of a precursor of poly(4,4'-oxydiphenylenepyromellitimide) and a mixture of at least three solvents which are poor solvents for the precursor when each solvent is used alone, a porous film of poly(4,4'-oxydiphenylenepyromellitimide) obtained from the film forming solution and a coated material where the porous film is formed on a base material.

27 Claims, 1 Drawing Sheet

FILM FORMING SOLUTION, POROUS FILM OBTAINED THEREFROM AND COATED MATERIAL WITH THE POROUS FILM

FIELD OF THE INVENTION

This invention relates to a film forming solution from which a poly(4,4'-oxydiphenylenepyromellitimide) porous film can be obtained, a porous film obtained therefrom and a coated material in which the porous film is formed on a base material.

BACKGROUND OF THE INVENTION

Among the aromatic polyimides, poly(4,4'-oxydiphenylenepyromellitimide) is widely used in films, coating materials, moldings and the like, as a polymer having excellent heat resistance and dynamic characteristics.

*Journal of Polymer Science, Macromolecular Reviews,* Vol. 11 (1976) discloses, in Table 2 on page 164, solvents capable of dissolving poly(4,4'-oxydiphenylenepyromellitamic acid) which is a typical precursor of poly(4,4'-oxydiphenylenepyromellitimide). Listed in this table as illustrative solvents are N,N-dimethylformamide (DMF), N-methyl-2-pyrrolidone (NMP), hexamethylphosphoramide (HMPA), N-methylcaprolactam, dimethyl sulfoxide (DMSO), N-acetyl-2-pyrrolidone, N,N-dimethylacetamide (DMAc) and the like. These solvents can dissolve the polyimide precursor when used alone and are called aprotic polar solvents. In addition, this reference discloses that these solvents can be used not only for dissolving a poly(amic acid) but also as a polymerization solvent when a poly(amic acid) is produced by the polymerization of a diamine with a tetracarboxylic acid dianhydride.

This same reference also discloses, on pages 199 to 205, that polyimide films can be obtained by removing solvents from solutions of poly(amic acid) dissolved in these aprotic polar solvents and carrying out imidization, and that polyimide-coated materials can be obtained by coating base materials with these solutions, followed by solvent removal and imidization.

Polyimide precursor solutions prepared using DMAc, NMP, DMSO, DMF and the like aprotic polar solvents are also disclosed in U.S. Pat. No. 4,238,528, JP-B-3-4588 (The term "JP-B" as used herein means an "examined Japanese patent publication") and *IBM Technical Disclosure Bulletin,* Vol.20, no.6, p.2041 (November, 1977). However, since these solvents have a large dipole moment, associate strongly with polyimide precursors used as solutes (Journal of Polymer Science, A-1, Vol. 4, pp. 2607–2616, 1966, *Journal of Polymer Science,* A, Vol. 25, pp. 2005–2020, 1987, *Journal of Polymer Science,* A, Vol. 25, pp. 2479–2491, 1987, *Kogyo Kagaku Zasshi,* Vol. 71, no. 9, pp. 1559–1564, 1968, and Abstract of ANTEC '91, pp. 1742–1745) and have strong solvation with the solutes used, they cause the following problems when polyimide films or coated materials are produced. That is, in a solution prepared by dissolving a polyimide precursor in the aforementioned currently used aprotic polar solvent, the polyimide precursor and the solvent are strongly solvated, thus leading to difficulty in removing the solvent at the time of molding or coating and therefore causing a problem in terms of insufficient dynamic and electric characteristics of the resulting moldings or coated materials due to the large amount of remaining solvent. In addition, the remaining solvent in the moldings causes another problem in that it generates toxic gases such as carbon monoxide and the like upon its decomposition caused by high temperature at the time of the use of the product.

Also, since they are hygroscopic in nature, these solvents pose still another problem when they are used as a polymerization solvent. That is, when water is present in the solvent, it causes hydrolysis of acid anhydrides and changes in the polyimide precursor solution formed with the passage of time, thus requiring reaction in a strictly water-free system which requires a complex reaction apparatus. In addition, since these solvents have a large surface tension due to their large dipole moment and a high viscosity as described in JP-B-3-4588, a sufficiently uniform coating cannot be obtained in a film or a coated material, and such a coating has insufficient adhesion to base materials.

Contrary to this, the inventors of the present invention found an important solvent system which can resolve many problems inherent in these aprotic polar solvents, and filed a patent application on a polyimide precursor solution that does not use aprotic polar solvents (JP-A-6-1915).

Specifically, the present inventors found that a solution of a polyimide precursor having a high polymerization degree can be produced easily at low cost even if water is present when a mixture of solvents, which individually do not solvate strongly with the polyimide precursor when used alone, is used as a polymerization solvent, that the polyimide precursor in this solution does not solvate strongly with the solvent and that polyimide moldings such as strings, films and the like, as well as coated materials, having excellent characteristics can be obtained from this solution. However, when a solution prepared using these solvents was spread on a base material to remove the solvents and then subjected to imidization, the resulting film was not a porous film but a film having no pores.

Polyimide porous films are used as gas or liquid separation films. JP-A-57-170934 and JP-A-57-170935 (The term "JP-A" as used herein means an "unexamined published Japanese patent application") disclose polyimide porous films obtained by the use of polyimide solutions which comprise polyimides prepared from benzophenonetetracarboxylic acid or biphenyltetracarboxylic acid and an aromatic diamine and good and poor solvents of these polyimides, and processes for the production of these films. However, since polyimide porous films obtained by these processes are derived from solvent-soluble polyimides, they are inferior to poly(4,4'-oxydiphenylenepyromellitimide) films in terms of heat and chemical resistances and therefore can be used only for a limited purpose.

JP-B-61-53086 also discloses a process for the production of a polyimide porous film in which a film formed from a solution of a poly(amic acid) dissolved in the aforementioned aprotic polar solvent is allowed to contact a coagulation solution comprising water or a lower alcohol, and the thus formed coagulation film is dried and subjected to heat imidization. According to this process, a polyimide porous film containing poly(4,4'-oxydiphenylenepyromellitimide) having excellent heat and chemical resistances can be obtained, but it shows insufficient gas permeability (in the case of hydrogen for example, its gas permeability is merely from 0.0016 to 0,011 $cm^3/cm^2 \cdot sec \cdot cmHg$).

In addition, JP-A-57-170936 discloses polyimide porous films, as well as a process for the production thereof, which porous films are obtained by preparing a polyimide precursor film using a solution of a polyimide precursor dissolved in a mixture of good and poor solvents for the precursor, and heating the thus prepared precursor film to effect removal of the solvents and imidization of the film. This unexamined published patent application states that these polyimide porous films are useful as gas separation films, because these films are composed of poly(4,4'-oxydiphenylenepyromellitimide) and the like and therefore have excellent heat and chemical resistance.

However, since the process of JP-A-57-170936 uses the aforementioned aprotic polar solvents which are good solvents of the polyimide precursor, it has various problems inherent with these aprotic polar solvents. In addition, since aprotic polar solvents which remain in the film soften the polyimide precursor film when the film is subjected to heating to effect a ring closure reaction, movement of the polymer molecules becomes frequent, which causes rearrangement of the molecules, as has been noted in *Polymer Engineering Science*, Vol.29, pp.347–351 (1989) and *Advances in Polyimide Science and Technology*, Tecnomic Publishing Co., Inc., pp.360–373 (1991).

Because of such softening of the film and rearrangement of the polymer molecules, the fine porous structure once formed at the time of polyimide precursor film preparation ceases to exist, resulting in difficulty in obtaining sufficient gas permeability, as has been pointed out in Membrane, Vol.15, pp.139–146 (1990).

For the purpose of overcoming this problem, *Membrane*, Vol.15, pp.139–146 (1990) and *Membrane*, Vol.17, pp.42–47 (1992) disclose a process in which a polyimide porous film comprising poly(4,4'-oxydiphenylenepyromellitimide) is obtained for use as a gas separation film, by carrying out heat treatment in high boiling point solvents to effect imidization while maintaining the fine porous structure formed at the time of the preparation of the polyimide precursor film. However, the gas permeability cannot be improved to a satisfactory level even by the use of this process.

In addition, JP-B-58-25690 discloses a process in which a polyimide porous film is produced by forming a polyimide precursor film on a glass plate using a polyimide precursor solution and soaking the resulting plate in a liquid which chemically converts the precursor into the corresponding polyimide. However, the gas permeability cannot be improved to a satisfactory level by the use of this process.

Since they exhibit excellent electrical characteristics, polyimides are also useful as electronic materials such as insulating layers for semiconductor elements and insulating films for flexible circuit boards. However, with the recent large scale integration of semiconductor elements and circuits and high-speed signal systems, great concern has been directed toward the development of materials having more excellent electrical characteristics, including dielectric characteristics. An improvement of dielectric characteristics may be achieved, for example, by a process in which a polyimide film is made into a porous structure by introducing fine pores into the film. Such a process can decrease the dielectric constant of the film while maintaining full characteristics of the polyimide. For example, *Advances in Polyimide Science and Technology*, Tecnomic Publishing Co., Inc., pp.184–197 (1991) discloses a process in which a porous film is produced by first molding a film from a solution of a copolymer consisting of a polyimide having a specified structure and polyethylene oxide and then subjecting the film to sintering to effect decomposition and removal of polyethylene oxide. Though this reference states that the porous film obtained by this process is useful as a semiconductor insulating film, this porous film cannot be put into practical use because of its inferior solvent resistance due to the use of a solvent soluble polyimide.

A polyimide film whose dielectric constant is reduced by changing its chemical structure is known for use as an insulating film for flexible circuit boards. Though dielectric characteristics can be improved by changing the chemical structure of the film, this change results in a decrease in other characteristics. A reduction of the dielectric constant by providing a polyimide film for flexible circuit board width a porous structure seems to be very effective, but no information is available to date concerning a polyimide porous film which comprises poly(4,4'-oxydiphenylenepyromellitimide) and which has excellent dielectric characteristics and sufficient dynamic characteristics.

As has been described in the foregoing, there are no porous films composed of poly(4,4'-oxydiphenylenepyromellitimide) which have markedly excellent heat and chemical resistance and which can be produced without using aprotic polar solvents such as DMF, NMP, DMAc, DMSO and the like, which solvents are disadvantageous from various points of view.

SUMMARY OF THE INVENTION

In view of the above, an object of the present invention is to provide a film forming solution which does not require aprotic polar solvents such as DMF, NMP, DMAc, DMSO and the like, to provide a porous film of poly(4,4'-oxydiphenylenepyromellitimide) obtained from such a film forming solution which has excellent heat and chemical resistance, is controllable in terms of film porosity and pore size and has excellent electrical characteristics, and to provide a coated material in which such a porous film is formed on a base material.

The inventors herein conducted extensive studies to achieve the above objects and found that:

a poly(4,4'-oxydiphenylenepyromellitimide) precursor can be dissolved in a mixture of at least three solvents which are poor solvents for the poly(4,4'-oxydiphenylenepyromellitimide) precursor when used alone;

that a porous film of the poly(4,4'-oxydiphenylenepyromellitimide) precursor can be produced from the resulting solution;

that a porous film of poly(4,4'-oxydiphenylenepyromellitimide) and a coated material in which this porous film is formed on a base material can be obtained without harming the fine porous structure thereof by subjecting the precursor porous film to a ring closure reaction;

that a variety of porous films ranging from those having substantially no gas permeability (i.e., $10^{-7}$ cm$^3$/cm$^2$·sec·cmHg or less) to those having extremely high gas permeability (i.e., 0.1 cm$^3$/cm$^2$·sec·cmHg or more) can be produced because porosity and pore size can be controlled by changing the combination and the mixing ratio of the poor solvents; and that the dielectric constant can also be changed by controlling porosity and pore size.

The present invention was accomplished on the basis of these findings.

Accordingly, the gist of the present invention resides:

first, in a film forming solution consisting essentially of a precursor of poly(4,4'-oxydiphenylenepyromellitimide) and a mixture of at least three solvents selected from those which are poor solvents for the precursor when used alone;

second, in a porous film of poly(4,4'-oxydiphenylenepyromellitimide) which is obtained by forming a porous film of a precursor of poly(4,4'-oxydiphenylenepyromellitimide) from the above film forming solution and subsequently effecting ring closure of the film-constituting polyimide precursor; and third, in a coated material in which the above porous film is formed on a base material.

Other objects and advantages of the present invention will be made apparent from the following disclosure.

DETAILED DESCRIPTION OF THE INVENTION

Figure 1:
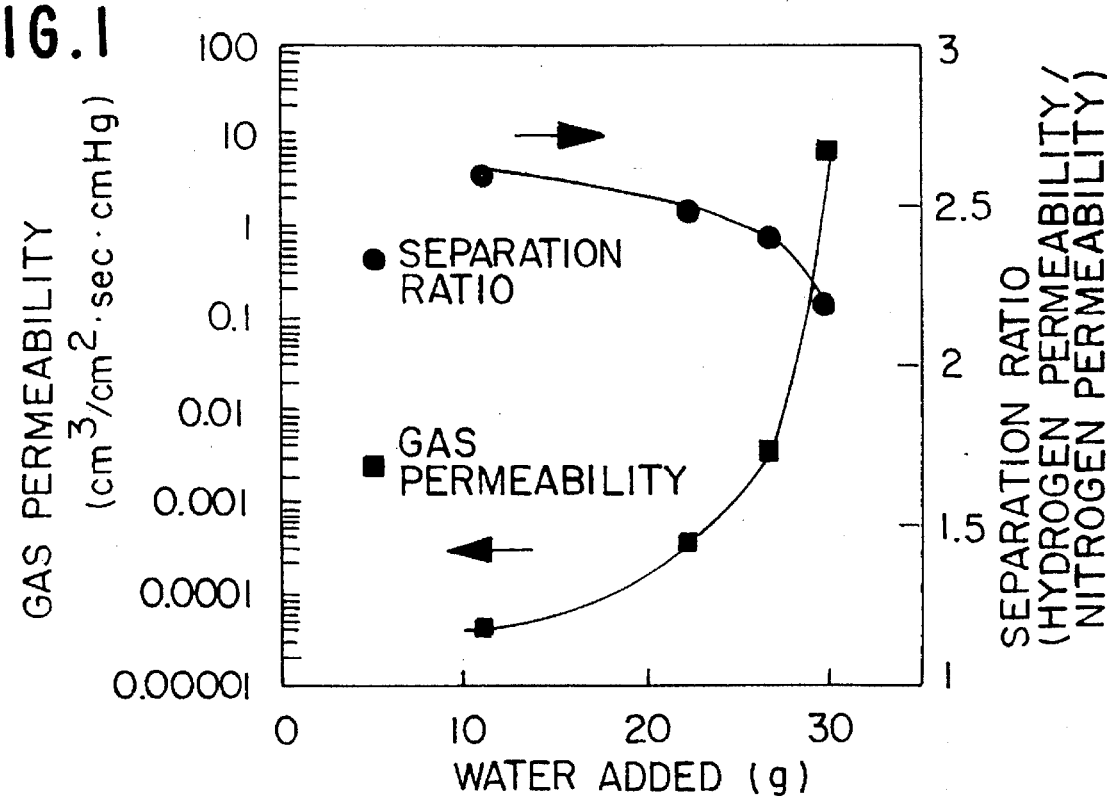
FIG. 1 is a graph showing the effect of the amount of added water on the hydrogen gas permeability and the separation ratio of a poly(4,4'-oxydiphenylenepyromellitimide) porous film.

First, a definition of the terms used in the present invention will be given.

(1) Polyimide precursor

The term "polyimide precursor" as used herein means poly(4,4'-oxydiphenylenepyromellitamic acid) or poly(4,4'-oxydiphenylenepyromellitamic acid) of which ring closure has been occurred partially. The term "ring closure" means a reaction to form a polyimide structure. In the latter case, 30 mole % or less of the repeating units may form the polyimide structure. The term "polyimide precursor" as used herein, therefore, means a precursor of poly(4,4'-oxydiphenylenepyromellitimide). According to the present invention, ring closure of the polyimide precursor may be effected by usually used means such as a procedure in which the precursor is heated or a procedure in which a cyclization agent such as acetic-anhydride, pyridine or the like is used (*Journal of Polymer Science, Macromolecular Reviews*, Vol.11, pp.161–208, herein incorporated by reference).

(2) Poly(4,4'-oxydiphenylenepyromellitimide)

An organic polymer in which at least 70 mole % of the repeating units of its chain consist of a 4,4'-oxydiphenylenepyromellitimide structure represented by the formula:

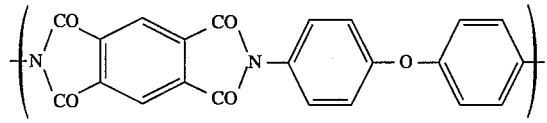

and less than 30 mole % of the other repeating units consist of the structure represented by the formula:

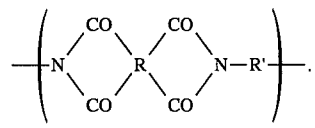

In the formula, R is a tetravalent aromatic radical having 1 to 5 benzenoid-unsaturated rings of 6 carbon atoms, the four carbonyl groups being directly bonded to different carbon atoms in a benzene ring of the R radical and each pair of carbonyl groups being bonded to adjacent carbon atoms in the benzene ring of the R radical. The followings are illustrative examples of R:

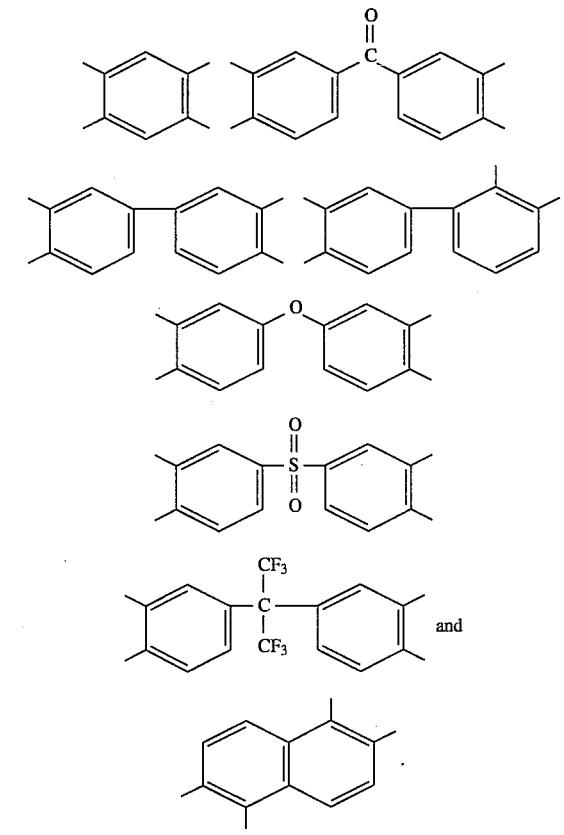

In the formula, R' is a divalent aromatic radical having 1 to 5 benzenoid-unsaturated rings of 6 carbon atoms, the two amino groups being directly bonded to different carbon atoms in the benzene ring of the R' radical. The followings are illustrative examples of R':

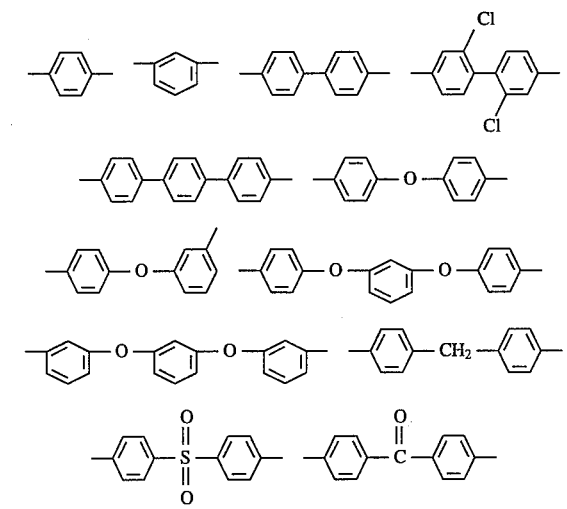

-continued

[chemical structures:]

—⌬—C(=O)—⌬—    —⌬(CH₃)(CH₃)   —⌬(CH₃)—CH₃

—⌬—O—⌬—C(CH₃)(CH₃)—⌬—O—⌬—

—⌬—O—⌬—C(CH₃)(CH₃)—⌬—O—⌬

—⌬—O—⌬—C(CF₃)(CF₃)—⌬—O—⌬—

—⌬—O—⌬—S(=O)(=O)—⌬—O—⌬— and

—⌬—NHCO—⌬—CONH—⌬—.

The poly(4,4'-oxydiphenylenepyromellitimide) may be a block copolymer, a random copolymer, and the like consisting of the repeating units described above. Preferably, however, 100 mole % of the repeating units of its chain consist of poly(4,4'-oxydiphenylenepyromellitimide).

(3) Poor solvent
A solvent not capable of dissolving 1 g/100 ml or more of a poly(4,4'-oxydiphenylenepyromellitimide) precursor at 25° C.

(4) Porous film
The term "porous film" as used herein means a porous film itself or a porous film formed on a base material by coating or the like.

(5) Gas permeability
A porous film of poly(4,4'-oxydiphenylenepyromellitimide) (thickness: 17–41μm) was placed in an open stainless steel cell having an area of 12.5 cm² so that gas could be passed through the porous film (film area also=12.5 cm²). Nitrogen and hydrogen gases were supplied at a temperature of 20° C. from one side of the porous film at a pressure of 0.2 to 1 kg/cm² to measure the volume of the gases permeated through the poly(4,4'-oxydiphenylenepyromellitimide) porous film using a flow meter, and the gas permeability was calculated based on the following equation.

Gas permeability =

$$\frac{\text{gas volume premeated } (STP)}{\text{area of porous film} \times \text{time} \times \text{pressure}^*} \text{ in } (cm^3/cm^2 \cdot sec \cdot cmHg)$$

*: permeation area × permeation time × pressure differential over the porous film (6) Dielectric constant
A porous film of poly(4,4'-oxydiphenylenepyromellitimide) was coated on the smooth surface of a copper foil, a silver paste was applied to the thus coated porous film in a circular form 6.2 cm in diameter and the resulting laminate was dried in air at 80° C. for 10 hours to prepare a capacitor of the porous film of poly(4,4'-oxydiphenylenepyromellitimide) interposed between the copper and the silver paste. Using an impedance analyzer (Model 4194A, Hewlett Packard S.A.), the electrostatic capacitance of the capacitor was measured at 1 MHz, which permits one to calculate the dielectric constant, based on the following equation.

$$\text{Dielectric constant} = \frac{\text{electrostatic capacitance} \times \text{thickness}}{\text{permittivity of vacuum} \times \text{area}} \quad (-)$$

Permittivity of vacuum: $8.85419 \times 10^{-12}$ $C^2 N^{-1} M^{-2}$ (MKSA unit)

According to the present invention, the polyimide precursor preferably has an intrinsic viscosity ($\eta$) of 0.3 or more, more preferably 0.7 or more, and most preferably 1.0 or more. Though not particularly limited, the intrinsic viscosity may have an upper limit of about 6. If the intrinsic viscosity ($\eta$) is smaller than 0.3, a porous film having insufficient strength is obtained. The intrinsic viscosity ($\eta$) is a value directly related to the molecular weight of a polymer and can be calculated using the following equation after measuring the flow time of a poly(4,4'-oxydiphenylenepyromellitimide) precursor solution (0.5% by weight thereof in N,N-dimethylacetamide) and of the DMA at 30° C. through a constant volume capillary tube of a standard viscometer (Ubbelohde's viscometer).

$$\text{Intrinsic viscosity} = \frac{\ln \frac{\text{flow time of solution}}{\text{flow time of solvent}}}{c}$$

c: Precursor concentration (grams of the precursor dissolved in 100 ml of solution)

The solvent used for the preparation of the film forming solution of the present invention is a mixture of at least three (preferably from three to five) solvents each of which is a poor solvent for the polyimide precursor when used alone. Examples of the combination of these poor solvents include: (1) a water soluble ether compound, a water soluble alcohol compound and water; (2) a water soluble ether compound, a water soluble alcohol compound and an aromatic hydrocarbon; and (3) a water soluble ether compound, a water soluble alcohol compound and an aliphatic hydrocarbon. The term "water soluble" as used herein means that the compound is completely soluble in water.

The water soluble ether compound wherein the number of the carbon atoms divided by the number of ether groups is 4 or less is preferable. Illustrative examples of the water soluble ether compound include tetrahydrofuran (THF), dioxane, trioxane, 1,2-dimethoxyethane, diethylene glycol dimethyl ether, diethylene glycol diethyl ether and the like, of which THF is particularly preferred.

The water soluble alcohol compound wherein the number of the carbon atoms divided by the number of hydroxyl groups is 4 or less is preferable. Illustrative examples of the water soluble alcohol compound include methanol, ethanol, 1-propanol, 2-propanol, tert-butyl alcohol, ethylene glycol, 1,2-propanediol, 1,3-propanediol, 1,3-butanediol, 1,4-butanediol, 2,3-butanediol, 1,5-pentanediol, 2-butene- 1,4-diol, 2-methyl-2,4-pentanediol, glycerol, 2-ethyl-2 -hydroxymethyl-1,3-propanediol, 1,2,6-hexanetriol and the like, of which methanol is particularly preferred.

Illustrative examples of the aromatic hydrocarbon include benzene, toluene, xylene and the like, of which toluene is particularly preferred.

Illustrative examples of the aliphatic hydrocarbon include aliphatic hydrocarbons having 6 to 20 carbon atoms, of which decane of 10 carbon atoms is particularly preferred.

The film forming solution of the present invention can be produced, for example, by effecting polymerization of pyromellitic dianhydride with 4,4'-diaminodiphenyl ether in a mixture of at least two solvents including a water soluble ether compound and a water soluble alcohol compound (both as earlier exemplified) to prepare a poly(4,4'-oxydiphenylenepyromellitimide) precursor solution, and adding water, an aromatic hydrocarbon or an aliphatic hydrocarbon (both as earlier exemplified) to the thus prepared precursor solution. The amounts of the water soluble ether compound and the water soluble alcohol compound as well as the water, aromatic hydrocarbon or aliphatic hydrocarbon can be decided based on the range or ratio in the resulting film forming solution described below. Generally, the polymerization is carried out under the ordinary pressure at −30° to 60° C.-for 1 to 200 minutes. Please also refer to *Journal of Polymer Science, Macromolecular Reviews*, Vol.11, pp.161–208, herein incorporated by reference.

The concentration of the polyimide precursor in the film forming solution of the present invention may be in the range of preferably from 0.1 to 60% by weight, more preferably from 1 to 25% by weight, based on the total weight of the solution. Also, the water soluble ether compound and the water soluble alcohol compound may be mixed at a weight ratio of preferably from 90 weight parts:10 weight parts to 56 weight parts:44 weight parts. Poor solvents other than the water soluble ether and water soluble alcohol compound may be used in an amount of preferably from 0.1 to 35% by weight, more preferably from 4 to 30% by weight based on the total weight of the solution. When the ratio of an aromatic or aliphatic hydrocarbon or water to the water soluble ether and alcohol compounds is increased, a porous film obtained from the resulting film forming solution can have a large porosity, but addition of the aromatic or aliphatic hydrocarbon or water exceeding the above amount will not provide an uniform solution due to precipitation of the polyimide precursor.

A porous film of poly(4,4'-oxydiphenylenepyromellitimide) can be obtained from the film forming solution of the present invention by any of the following known film forming processes.

(a) The film forming solution is coated on the smooth surface of a base material such as a metal, glass, and plastic film and dried at 10° to 80° C. for 0.1 to 4 hours to form a porous film of the polyimide precursor on the base material. Thereafter, the thus formed polyimide precursor porous film is removed from the base material, and its imidization is effected by heating for 0.5 to 5 hours at 150° to 300° C. (or by soaking the polyimide precursor porous film in a cyclization agent consisting of acetic anhydride and pyridine for 1 to 20 hours at 10° to 40° C.), thereby obtaining a poly(4,4'-oxydiphenylenepyromellitimide) porous film.

(b) Alternatively, a material coated with a porous film of poly(4,4'-oxydiphenylenepyromellitimide) may be obtained by heating a coated material, in which a polyimide precursor porous film is formed on a base material, at 150° to 300° C. for 0.5 to 5 hours (or by soaking the polyimide precursor porous film-coated material in a cyclization agent consisting of acetic anhydride and pyridine for 1 to 20 hours at 10° to 40° C.). Examples of the base material include a metal foil, metal wire, semiconductor, plastic film, and the like and examples of the metal include gold, platinum, silver, copper, aluminum, chrome, and the like.

(c) Also, a poly(4,4'-oxydiphenylenepyromellitimide) porous film may be obtained from the coated material resulting from the above process (b) by separating the poly(4,4'-oxydiphenylenepyromellitimide) porous film from the base material.

With the film forming solution of the present invention, the porosity and pore size (ellipse or circle; length: 0.1–10 µm, width: 0.05–5 µm) of the resulting film can be changed by changing the type of the poor solvent other than the water soluble ether and alcohol compounds, namely water, an aromatic hydrocarbon or an aliphatic hydrocarbon, or by changing the blending ratio of each component in the film forming solution, thus rendering possible the production of a variety of porous films ranging from a porous film having substantially almost no gas permeability to a porous film having an extremely high gas permeability of $7.0 cm^3/cm^2 \cdot sec \cdot cmHg$ or more. When the amount of water, an aromatic hydrocarbon or an aliphatic hydrocarbon is increased, the porosity increases. By adding an aromatic hydrocarbon without water, a film having a small pore size can be obtained. Addition of water increases the pore size. A porous film having high gas permeability can be advantageously used as a gas separation film or a liquid separation film. In the same manner, it is possible to obtain a porous film consisting of layers having different densities and a coated material in which such a type of porous film is formed on a base material. The gas permeability of the porous film according to the present invention is preferably $0.1 cm^3/cm^2 \cdot sec \cdot cmHg$ or more and $0.7 cm^3/cm^2 \cdot sec \cdot cmHg$ or less.

Also, since the dielectric constant of the porous film can be controlled by adjusting the porosity of the film, a porous film having a dielectric constant of less than 3.0 (preferably from 1.5 to 3.0) can be obtained. A porous film having such a low dielectric constant can be advantageously used as an insulating film for flexible circuit boards and the like.

The porosity of the porous film of the present invention is from 0.02 to 0.7 and the thickness of the porous film of the present invention is from 5 to 100 µm.

Since the film forming solution of the present invention consists essentially of a precursor of poly(4,4'-oxydiphenylenepyromellitimide) and a mixture of at least three solvents which are poor solvents for the polyimide precursor when used alone, removal of solvents at the time of molding or coating is easy so that a porous film of poly(4,4'-oxydiphenylenepyromellitimide) containing substantially no residual solvents can be produced much easier than in the case with the prior art processes in which aprotic polar solvents are used.

Also, the fine porous structure formed in a porous film of the polyimide precursor before imidization is not harmed when the porous film is subjected to heat imidization, while such harm is common in the case of the use of aprotic polar solvents. As a consequence, a porous film of poly(4,4'-oxydiphenylenepyromellitimide) can be produced much easier as compared to the prior art processes in which aprotic polar solvents are used. In addition, the thus produced porous film possesses excellent heat and chemical resistance due to its chemical structure.

EXAMPLES

The following examples are provided to further illustrate the present invention. It is to be understood, however, that the examples are for purpose of illustration only and are not intended as a definition of the limits of the present invention. Unless otherwise indicated, all procedures in the Examples were carried out in air.

EXAMPLES 1 to 4

An 8.00 g portion of diaminodiphenyl ether was dissolved in a mixed solvent consisting of 119.2 g of THF and 31.8 g of methanol at 13° C., and the resulting solution was kept at 13° C. 8.80 g of pyromellitic dianhydride was added to the solution in one portion, and the mixture was stirred for 18 hours at 20° C. to obtain an uniform yellow solution of a poly(amic acid) having an intrinsic viscosity of 1.42. By adding predetermined amounts of water as shown in Table 1, uniform film forming solutions were prepared.

Using an automatic film applicator (Yasuda Seiki Co., Ltd.), each of the thus obtained film forming solutions was spread on a glass plate at a speed of 40 mm/s and to a thickness of 500 μm. After 20 minutes of drying at 25° C., the thus formed film was separated from the glass plate and heated at 80° C. for 2 hours and then at 300° C. for 3 hours to effect imidization.

In this way, porous films of poly(4,4'-oxydiphenylenepyromellitimide) were obtained. When sectional SEM images of each film were observed, a large number of elliptic pores having a length of 5 to 7 μm and a width of 1 to 3 μm were found over the entire area of the film. The densities and hydrogen gas permeabilities of these films are shown in Table 1.

TABLE 1

| | Amount of water added (g) | Thickness of film (μm) | Density (g/cm$^3$) | Hydrogen gas permeability (cm$^3$/cm$^2$ · sec · cmHg) |
|---|---|---|---|---|
| Example 1 | 11.1 | 40 | 1.18 | $4.2 \times 10^{-5}$ |
| Example 2 | 22.4 | 40 | 0.89 | $3.8 \times 10^{-4}$ |
| Example 3 | 26.7 | 41 | 0.60 | $3.7 \times 10^{-3}$ |
| Example 4 | 29.8 | 41 | 0.50 | 7.0 |

The effects of the amount of added water on the hydrogen gas permeability and the hydrogen/nitrogen separation ratio (hydrogen gas permeability/nitrogen gas permeability) are shown in FIG. 1.

As is clear from the results shown in Table 1 and FIG. 1, the formation of films by this method makes possible the production of films having different gas permeabilities ranging from low to high by simply changing the amount of water added. Especially, as is evident from the results of Example 4, a film having a high gas permeability which cannot be obtained by prior art processes can be produced, and its hydrogen/nitrogen separation ratio is not harmed even at an extremely high gas permeability of 7.0 cm$^3$/cm$^2$·sec·cmHg.

EXAMPLES 5 to 8

An 8.0 g portion of diaminodiphenyl ether was dissolved in a mixed solvent consisting of 117.9 g of tetrahydrofuran and 33.2 g of methanol at 30° C. and the resulting solution was kept at 30° C. 8.78 g of pyromellitic dianhydride was added to the solution in one portion, and the mixture was stirred for 1 hour to obtain an uniform yellow solution. The thus obtained solution was concentrated under reduced pressure until its solid content became 15.1%. At this stage, the poly(amic acid) solution had an intrinsic viscosity of 0.9. By adding predetermined amounts of toluene as shown in Table 2 to 100.0 g of this solution, uniform film forming solutions were prepared.

In the same manner as described in Example 1, each of the thus obtained film forming solutions was spread on a copper foil having an uniform surface and a thickness of 35 μm, which copper foil had been fixed on a glass plate, at a speed of 40 mm/s and to a thickness of 200 μm. After drying at room temperature for 3 minutes and then at 60° C. for 1 hour, the resulting laminate was heated at 300° C. for 3 hours in an atmosphere of nitrogen to effect imidization. When sectional SEM images of each of the copper/poly(4,4'-oxydiphenylenepyromellitimide) porous films were observed, a large number of elliptic pores having a length of 2 to 3 μm and a width of 1 μm were found in the film but only at the half in contact with the copper; the remaining half of the film was found to be a fine and uniform layer (each viewed in a direction perpendicular to the surface of the copper). The thicknesses, densities and dielectric constants at 1 MHz of the thus obtained poly(4,4'-oxydiphenylenepyromellitimide) porous films are shown in Table 2.

TABLE 2

| | Amount of toluene or water added (g) | Thickness of film (μm) | Density (g/cm$^3$) | Dielectric constant (—) |
|---|---|---|---|---|
| Example 5 | 2.5 | 21 | 1.37 | 3.31 |
| Example 6 | 5.0 | 20 | 1.35 | 3.31 |
| Example 7 | 7.5 | 20 | 1.26 | 2.88 |
| Example 8 | 10.0 | 21 | 1.14 | 2.63 |
| Example 9 | 15.0 | 17 | 1.03 | 2.30 |

Figure 2:
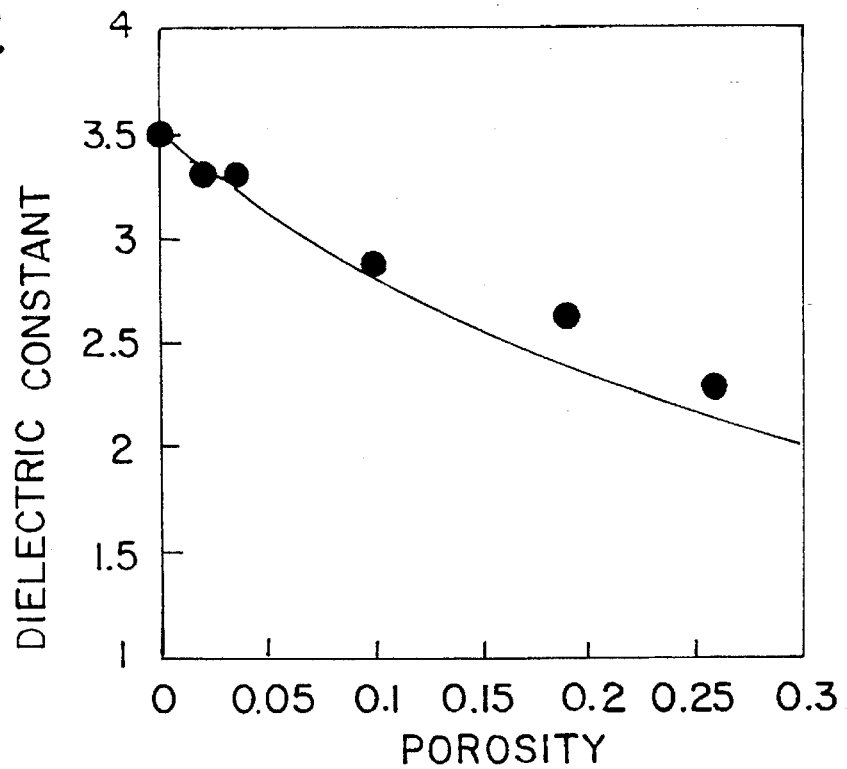
FIG. 2 is a graph showing the relationship between the porosity of a poly(4,4'-oxydiphenylenepyromellitimide) porous film and the dielectric constant.

The relationship between the porosity of the poly(4,4'-oxydiphenylenepyromellitimide) porous film and its dielectric constant at 1 MHz is shown in FIG. 2. The porosity of these porous films was calculated from the density of the porous film assuming the density of poly(4,4'-oxydiphenylenepyromellitimide) having no pore is 1.42 g/cm$^3$.

In addition, poly(4,4'-oxydiphenylenepyromellitimide) porous films were obtained from these copper/poly(4,4'-oxydiphenylenepyromellitimide) porous film coated materials by removing the copper by etching. The hydrogen gas permeabilities of these porous films were found to be 10$^7$ cm$^3$/cm$^2$·sec·cmHg or less.

EXAMPLE 9

An 8.0 g portion of diaminodiphenyl ether was dissolved in a mixed solvent consisting of 117.9 g of tetrahydrofuran and 33.2 g of methanol at 30° C. and the resulting solution was kept at 30° C. A 8.78 g of pyromellitic dianhydride was added to the solution in one portion, and the mixture was stirred for 1 hour to obtain an uniform yellow solution. The thus obtained solution was concentrated under reduced pressure until its solid content became 15.1%. At this stage, the poly(amic acid) solution had an intrinsic viscosity of 0.9. By adding 15 g of water to 100.0 g of this solution, an uniform film forming solution was prepared.

In the same manner as described in Example 1, the thus obtained film forming solution was spread on a copper foil having an uniform surface and a thickness of 35 μm, which had been fixed on a glass plate, at a speed of 40 mm/s and to a thickness of 200 μm. After drying at room temperature for 3 minutes and then at 60° C. for 1 hour, the resulting laminate was heated at 300° C. for 3 hours in an atmosphere of nitrogen to effect imidization. The poly(4,4'-oxydiphenylenepyromellitimide) porous film thus obtained was yellow and opaque. When sectional SEM images of the copper/poly(4,4'-oxydiphenylenepyromellitimide) porous film were observed, a large number of elliptic pores having a length of 4 to 5 μm and a width of about 1 μm were found in the poly(4,4'-oxydiphenylenepyromellitimide) porous film but only in the half in contact with the copper; the remaining half of the film was found to be a fine and uniform layer. The thickness, density and dielectric constant at 1 MHz of the thus obtained poly(4,4'-oxydiphenylenepyromellitimide)

porous film are shown in Table 2. The relationship between the porosity of the poly(4,4'-oxydiphenylenepyromellitimide) porous film and its dielectric constant at 1 MHz is shown in FIG. 2 together with the results of Examples 5 to 8. The porosity was calculated by the same way as in Examples 5 to 8.

Copper was then removed by etching from the copper/poly(4,4'-oxydiphenylenepyromellitimide) porous film coated material to obtain a poly(4,4'-oxydiphenylenepyromellitimide) porous film. The gas permeability of the porous film was found to be $10^7$ cm$^3$/cm$^2$·sec·cmHg or less.

EXAMPLE 10

8.0 g of diaminodiphenyl ether was dissolved in a mixed solvent consisting of 117.9 g of tetrahydrofuran and 33.2 g of methanol at 30° C., and the resulting solution was kept at 30° C. An 8.78 g portion of pyromellitic dianhydride was added to the solution in one portion, and the mixture was stirred for 1 hour to obtain an uniform yellow solution. The thus obtained solution was concentrated under reduced pressure until its solid content became 15.1%. At this stage, the poly(amic acid) solution had an intrinsic viscosity of 0.9. By adding 3.0 g of n-decane to 100.0 g of this solution, an uniform film forming solution was prepared.

In the same manner as described in Example 1, the thus obtained film forming solution was spread on a copper foil having an uniform surface and a thickness of 35 μm, which had been fixed on a glass plate, at a speed of 40 mm/s and to a thickness of 200 μm. After drying at room temperature for 3 minutes and then at 60° C. for 1 hour, the resulting laminate was heated at 300° C. for 3 hours in an atmosphere of nitrogen to effect imidization. The poly(4,4'-oxydiphenylenepyromellitimide) porous film thus obtained was yellow and opaque. This polyimide porous film had a thickness of 30 μm, a density of 1.00 g/cm$^2$ and a dielectric constant of 2.25 at 1 MHz. A poly(4,4'-oxydiphenylenepyromellitimide) porous film was prepared from the copper/poly(4,4'-oxydiphenylenepyromellitimide) porous film coated material by removing the copper by etching. The gas permeability of the porous film was found to be $10^7$ cm$^3$/cm$^2$·sec·cmHg or less.

Thus, as has been described in the foregoing, with the film forming solution of the present invention, removal of solvents at the time of molding or coating can be done easily and a porous film of poly(4,4'-oxydiphenylenepyromellitimide) containing substantially no residual solvents can be produced, because the inventive film forming solution consists essentially of a precursor of poly(4,4'-oxydiphenylenepyromellitimide) and a mixture of at least three solvents which are poor solvents of the polyimide precursor when used alone. Also, the porosity and pore size of the resulting film can be changed by changing the combination of the poor solvents and/or the blending ratio of each component in the film forming solution, thus making possible the production of a variety of porous films ranging from a porous film having no gas permeability to a porous film having high gas permeability. A porous film consisting of layers having different densities can also be obtained by varying the film forming solution as above. In addition, since the dielectric constant of the porous film can be controlled by adjusting the porosity of the film, a porous film having a low dielectric constant can be obtained.

While the invention has been described in detail and with reference to specific embodiments thereof, it will be apparent to one skilled in the art that various changes and modifications can be made therein without departing from the spirit and scope thereof.

What is claimed is:

1. A film forming solution consisting essentially of a precursor of poly(4,4'-oxydiphenylenepyromellitimide) and a mixture of at least three solvents selected from solvents which are poor solvents for the precursor when each of said solvents is used alone, wherein said poor solvents are solvents which are incapable of dissolving 1 g/100 ml or more of the poly(4,4'-oxydiphenylenepyromellitimide) precursor at 25° C.

2. The film forming solution according to claim 1 wherein said mixture of at least three solvents is consisting essentially of a water soluble ether compound, a water soluble alcohol compound and water.

3. The film forming solution according to claim 1 wherein said mixture of at least three solvents is consisting essentially of a water soluble ether compound, a water soluble alcohol compound and an aromatic hydrocarbon.

4. The film forming solution according to claim 1 wherein said mixture of at least three solvents is consisting essentially of a water soluble ether compound, a water soluble alcohol compound and aliphatic hydrocarbon.

5. The film forming solution according to claim 2, 3, or 4, wherein said water soluble ether compound is a compound of which number of carbon atoms divided by the number of ether groups is 4 or less.

6. The film forming solution according to claim 2, 3, or 4, wherein said water soluble alcohol compound is a compound of which number of carbon atoms divided by the number of hydroxyl groups is 4 or less.

7. The film forming solution according to claim 2 wherein said mixture of at least three solvents is consisting essentially of tetrahydrofuran, methanol and water.

8. The film forming solution according to claim 3 wherein said mixture of at least three solvents is consisting essentially of tetrahydrofuran, methanol and toluene.

9. The film forming solution according to claim 4 wherein said mixture of at least three solvents is consisting essentially of tetrahydrofuran, methanol and decane.

10. The film forming solution according to claim 2, wherein the mixing ratio of said water soluble ether compound and said water soluble alcohol compound is 90:10 to 56:44 by weight, and the concentration of said water is 0.1 to 35% by weight based on the total of the solution.

11. The film forming solution according to claim 3, wherein the mixing ratio of said water soluble ether compound and said water soluble alcohol compound is 90:10 to 56:44 by weight, and the concentration of said aromatic hydrocarbon is 0.1 to 35% by weight based on the total of the solution.

12. The film forming solution according to claim 4, wherein the mixing ratio of said water soluble ether compound and said water soluble alcohol compound is 90:10 to 56:44 by weight, and the concentration of said aliphatic hydrocarbon is 0.1 to 35% by weight based on the total of the solution.

13. The film forming solution according to claim 2, wherein the concentration of the polyimide precursor is 0.1 to 60% by weight, the concentration of the water soluble ether compound is 2.8 to 89.8% by weight, the concentration of the water soluble alcohol compound is 0.5 to 43.9% by weight, and the concentration of the water is 0.1 to 35% by weight.

14. The film forming solution according to claim 3, wherein the concentration of the polyimide precursor is 0.1 to 60% by weight, the concentration of the water soluble ether compound is 2.8 to 89.8% by weight, the concentration of the water soluble alcohol compound is 0.5 to 43.9% by weight, and the concentration of the aromatic hydrocarbon is 0.1 to 35% by weight.

15. The film forming solution according to claim 4, wherein the concentration of the polyimide precursor is 0.1 to 60% by weight, the concentration of the water soluble ether compound is 2.8 to 89.8% by weight, the concentration of the water soluble alcohol compound is 0.5 to 43.9% by weight, and the concentration of the aliphatic hydrocarbon is 0.1 to 35% by weight.

16. A porous film of poly(4,4'-oxydiphenylenepyromellitimide) obtained by forming a porous film of a precursor of poly(4,4'-oxydiphenylenepyromellitimide) from a film forming solution and subsequently effecting the ring closure of the porous film precursor, wherein the film forming solution consists essentially of the precursor of poly(4,4'-oxydiphenylenepyromellitimide) and a mixture of at least three solvents selected from solvents which are poor solvents for the precursor when each of said solvents is used alone, wherein said poor solvents are solvents which are incapable of dissolving 1 g/100 ml or more of the poly(4,4'-oxydiphenylenepyromellitimide) precursor at 25° C.

17. The poly(4,4'-oxydiphenylenepyromellitimide) porous film according to claim 16, wherein the mixture of at least three solvents consists essentially of a water soluble ether compound, a water soluble alcohol compound and water, wherein the mixing ratio of said water soluble ether compound and said water soluble alcohol compound is 90:10 to 56:44 by weight, and the concentration of said water is 0.1 to 35% by weight based on the total of the solution.

18. The poly(4,4'-oxydiphenylenepyromellitimide) porous film according to claim 16, wherein the mixture of at least three solvents consists essentially of a water soluble ether compound, a water soluble alcohol compound and an aromatic hydrocarbon, wherein the mixing ratio of said water soluble ether compound and said water soluble alcohol compound is 90:10 to 56:44 by weight, and the concentration of said aromatic hydrocarbon is 0.1 to 35% by weight based on the total of the solution.

19. The poly(4,4'-oxydiphenylenepyromellitimide) porous film according to claim 16 wherein the mixture of at least three solvents consists essentially of a water soluble ether compound, a water soluble alcohol compound and an aliphatic hydrocarbon, wherein the mixing ratio of said water soluble ether compound and said water soluble alcohol compound is 90:10 to 56:44 by weight, and the concentration of said aliphatic hydrocarbon is 0.1 to 35% by weight based on the total of the solution.

20. The poly(4,4'-oxydiphenylenepyromellitimide) porous film according to claim 16 wherein said porous film has a gas permeability of 0.1 $cm^3/cm^2 \cdot sec \cdot cmHg$ or more.

21. The poly(4,4'-oxydiphenylenepyromellitimide) porous film according to claim 16 wherein said porous film has a dielectric constant of less than 3.0.

22. The poly(4,4'-oxydiphenylenepyromellitimide) porous film according to claim 16 wherein said porous film is composed of layers having different densities.

23. The poly(4,4'-oxydiphenylenepyromellitimide) porous film according to claim 16, wherein the mixture of at least three solvents consists essentially of a water soluble ether compound, a water soluble alcohol compound and water, wherein the concentration of the polyimide precursor is 0.1 to 60% by weight, the concentration of the water soluble ether compound is 2.8 to 89.8% by weight, the concentration of the water soluble alcohol compound is 0.5 to 43.9% by weight, and the concentration of the water is 0.1 to 35% by weight.

24. The poly(4,4'-oxydiphenylenepyromellitimide) porous film according to claim 16, wherein the mixture of at least three solvents consists essentially of a water soluble ether compound, a water soluble alcohol compound and an aromatic hydrocarbon, wherein the concentration of the polyimide precursor is 0.1 to 60% by weight, the concentration of the water soluble ether compound is 2.8 to 89.8% by weight, the concentration of the water soluble alcohol compound is 0.5 to 43.9% by weight, and the concentration of the aromatic hydrocarbon is 0.1 to 35% by weight.

25. The poly(4,4'-oxydiphenylenepyromellitimide) porous film according to claim 16, wherein the mixture of at least three solvents consists essentially of a water soluble ether compound, a water soluble alcohol compound and an aliphatic hydrocarbon, wherein the concentration of the polyimide precursor is 0.1 to 60% by weight, the concentration of the water soluble ether compound is 2.8 to 89.8% by weight, the concentration of the water soluble alcohol compound is 0.5 to 43.9% by weight, and the concentration of the aliphatic hydrocarbon is 0.1 to 35% by weight.

26. A coating in which the poly(4,4'-oxydiphenylenepyromellitimide) porous film of claim 16 is formed on a base material.

27. The coating according to claim 26 wherein said base material is copper.

* * * * *